(12) United States Patent
Nakazawa

(10) Patent No.: US 9,179,083 B2
(45) Date of Patent: Nov. 3, 2015

(54) PHOTOELECTRIC CONVERSION ELEMENT, IMAGE READING DEVICE, IMAGE FORMING APPARATUS, IMAGE READING METHOD, AND IMAGE FORMING METHOD

(71) Applicant: Masamoto Nakazawa, Kanagawa (JP)

(72) Inventor: Masamoto Nakazawa, Kanagawa (JP)

(73) Assignee: RICOH COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/499,534

(22) Filed: Sep. 29, 2014

(65) Prior Publication Data
US 2015/0116794 A1      Apr. 30, 2015

(30) Foreign Application Priority Data
Oct. 24, 2013 (JP) .................................. 2013-221474

(51) Int. Cl.
| | | |
|---|---|---|
| H04N 1/04 | (2006.01) | |
| H04N 5/3745 | (2011.01) | |
| H01L 27/146 | (2006.01) | |
| H04N 1/193 | (2006.01) | |

(52) U.S. Cl.
CPC ...... *H04N 5/37455* (2013.01); *H01L 27/14603* (2013.01); *H01L 27/14641* (2013.01); *H01L 27/14643* (2013.01); *H04N 1/193* (2013.01); *H04N 2201/0081* (2013.01)

(58) Field of Classification Search
CPC ..... H04N 5/23212; H04N 7/18; H04N 9/045; H04N 13/0253; H04N 1/00013; H04N 1/1017; H04N 1/121; H04N 1/1235; H04N 1/193; G01N 21/66; G01N 21/8806; G01N 21/956; G02B 7/346; H01L 27/1461; H01L 27/14621; H01L 27/14627; H01L 27/146
USPC .............. 348/222.1, 294, 241, 273, 275, 296, 348/302, 333.05, 348; 358/474, 486, 496, 358/497, 498, 504
See application file for complete search history.

(56) References Cited

U.S. PATENT DOCUMENTS

| | | | | |
|---|---|---|---|---|
| 5,940,114 | A  * | 8/1999 | Kataoka et al. ................ | 347/248 |
| 7,209,702 | B2 * | 4/2007 | Kohchi et al. ................. | 399/377 |
| 7,852,521 | B2 * | 12/2010 | Aoki ............................. | 358/474 |
| 7,907,307 | B2 * | 3/2011 | Yamazaki .................... | 358/3.03 |

(Continued)

FOREIGN PATENT DOCUMENTS

| | | |
|---|---|---|
| JP | 61-255191 | 11/1986 |
| JP | 2001-332714 | 11/2001 |

(Continued)

OTHER PUBLICATIONS

U.S. Appl. No. 14/301,488, filed Jun. 11, 2014.

*Primary Examiner* — Negussie Worku
(74) *Attorney, Agent, or Firm* — Oblon, McClelland, Maier & Neustadt, L.L.P.

(57) ABSTRACT

A photoelectric conversion element comprises: a plurality of light-receiving elements that generates a charge for each pixel according to an amount of received light; and a plurality of pixel circuits that operates so as to derive the charge generated by the plurality of light-receiving elements from the plurality of light-receiving elements for each pixel. The plurality of light-receiving elements is arranged in a light-receiving area that receives light from outside, and the plurality of pixel circuits is provided in a non-light-receiving area that does not receive the light from outside.

16 Claims, 17 Drawing Sheets

(56) References Cited

U.S. PATENT DOCUMENTS

| | | | |
|---|---|---|---|
| 8,154,605 B2 * | 4/2012 | Muramatsu | 348/208.14 |
| 8,228,407 B2 * | 7/2012 | Egawa | 348/272 |
| 8,581,998 B2 * | 11/2013 | Ohno | 348/222.1 |
| 8,619,170 B2 * | 12/2013 | Mabuchi | 348/296 |
| 8,908,245 B2 | 12/2014 | Nakazawa | 358/518 |
| 8,953,885 B1 * | 2/2015 | Och et al. | 382/177 |
| 2006/0066916 A1 * | 3/2006 | Ishiguro et al. | 358/474 |
| 2007/0097443 A1 * | 5/2007 | Ishiguro et al. | 358/3.26 |
| 2007/0188638 A1 | 8/2007 | Nakazawa et al. | |
| 2008/0252787 A1 | 10/2008 | Nakazawa et al. | |
| 2009/0128658 A1 * | 5/2009 | Hayasaka et al. | 348/222.1 |
| 2010/0027061 A1 | 2/2010 | Nakazawa | |
| 2010/0134673 A1 | 6/2010 | Masuda | |
| 2010/0171998 A1 | 7/2010 | Nakazawa | |
| 2011/0026083 A1 | 2/2011 | Nakazawa | |
| 2011/0051201 A1 | 3/2011 | Hashimoto et al. | |
| 2011/0063488 A1 | 3/2011 | Nakazawa | |
| 2012/0008173 A1 | 1/2012 | Konno et al. | |
| 2012/0092732 A1 | 4/2012 | Nakazawa | |
| 2012/0224205 A1 | 9/2012 | Nakazawa | |
| 2013/0063792 A1 | 3/2013 | Nakazawa | |
| 2013/0070309 A1 * | 3/2013 | Sakai et al. | 358/474 |
| 2014/0029065 A1 | 1/2014 | Nakazawa | |
| 2014/0204427 A1 | 7/2014 | Nakazawa | |
| 2014/0204432 A1 | 7/2014 | Hashimoto et al. | |
| 2014/0211273 A1 | 7/2014 | Konno et al. | |
| 2014/0347708 A1 * | 11/2014 | Omori et al. | 358/475 |
| 2014/0368893 A1 * | 12/2014 | Nakazawa et al. | 358/497 |
| 2015/0130978 A1 * | 5/2015 | Tashiro et al. | 348/311 |

FOREIGN PATENT DOCUMENTS

| | | |
|---|---|---|
| JP | 2007-251461 | 9/2007 |
| JP | 2010-135464 | 6/2010 |
| JP | 2010-186818 | 8/2010 |
| JP | 2012-134987 | 7/2012 |
| JP | 2014-138406 | 7/2014 |

* cited by examiner

FIG.3
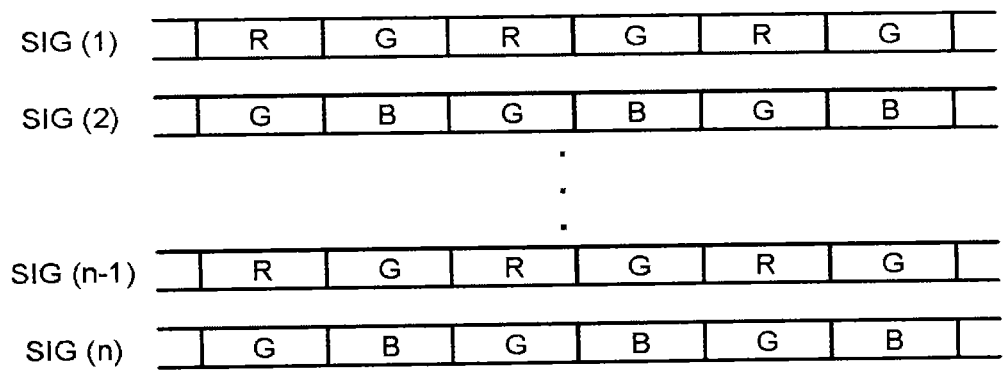
(a)
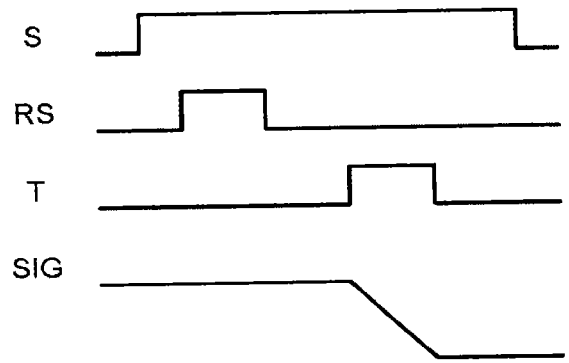
(b)

FIG.8
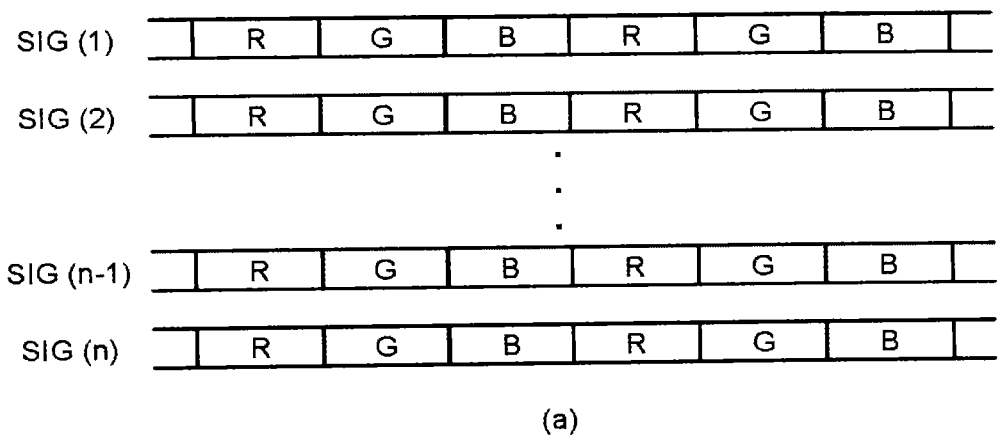
(a)
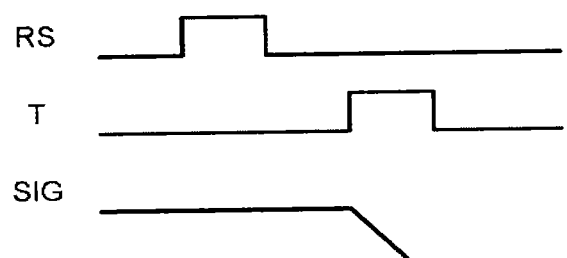
(b)

FIG.11
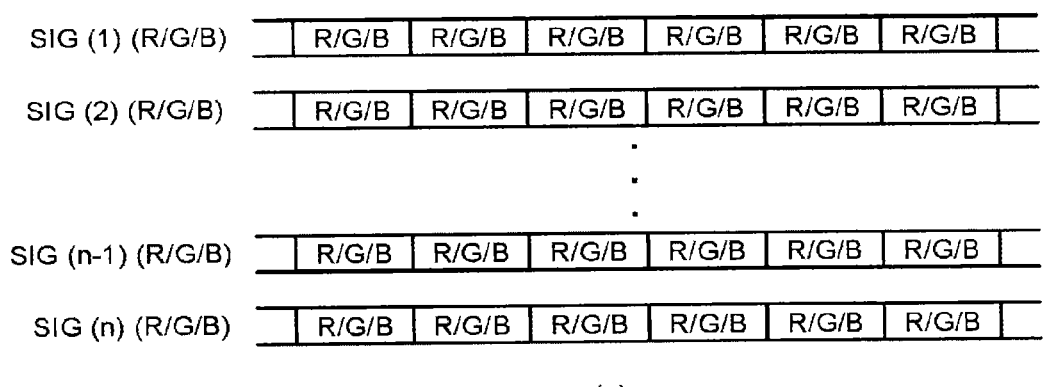
(a)
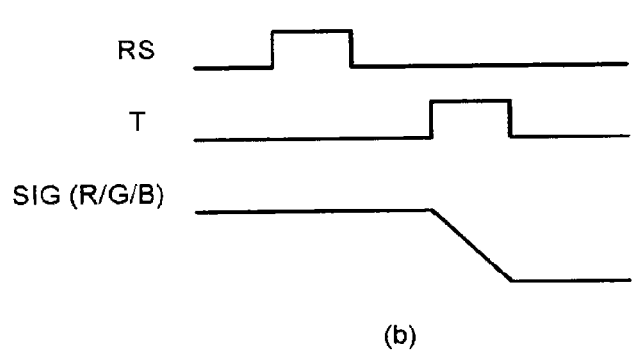
(b)

PHOTOELECTRIC CONVERSION ELEMENT, IMAGE READING DEVICE, IMAGE FORMING APPARATUS, IMAGE READING METHOD, AND IMAGE FORMING METHOD

CROSS-REFERENCE TO RELATED APPLICATIONS

The present application claims priority to and incorporates by reference the entire contents of Japanese Patent Application No. 2013-221474 filed in Japan on Oct. 24, 2013.

BACKGROUND OF THE INVENTION

1. Field of the Invention

The present invention relates to a photoelectric conversion element, an image reading device, an image forming apparatus, an image reading method, and image forming method.

2. Description of the Related Art

In an image reading device which reads a document, CCD is conventionally mainly used as a photoelectric conversion element which performs photoelectric conversion of reflected light from the document. Recently, a CMOS linear image sensor attracts attention as the photoelectric conversion element by request for higher speed and lower power consumption of the image reading device. The CMOS linear image sensor is the same as the CCD in that this performs the photoelectric conversion of incident light by using a photo diode. However, although the CCD transfers a charge by a shift register and performs charge-voltage conversion by a charge detection unit after the transfer, the CMOS linear image sensor performs the charge-voltage conversion in the vicinity of a pixel to output to a subsequent stage.

In the conventional CMOS linear image sensor, a photo diode (PD) which performs the photoelectric conversion, a floating diffusion (FD) which performs the charge-voltage conversion of the charge accumulated by PD, a reset circuit which resets potential of FD, and a source follower (SF) which buffers a voltage signal of FD to transmit to the subsequent stage are formed in the pixel. That is to say, the conventional CMOS linear image sensor has a problem that an area (opening) of the photo diode is limited by a portion other than the photo diode (pixel circuit) arranged in the pixel and sensitivity thereof is deteriorated.

This problem is especially remarkable in the CMOS linear image sensor for reduction optical system in which a pixel size is small as compared to a contact image sensor (CIS) for same-magnification optical system even in a case of the same CMOS linear image sensor.

As a technical example to solve the above-described problem, Japanese Laid-open Patent Publication No. 2010-135464 discloses a CMOS solid-state imaging element in which a plurality of pixel rows in which a plurality of pixels is one-dimensionally arranged is arranged, the solid-state imaging element provided with a first pixel circuit separately provided for each pixel arranged in each pixel and a second pixel circuit provided so as to be shared by the pixels of each column, the second pixel circuit arranged outside the pixel column.

However, the conventional CMOS linear image sensor has a problem that the sensitivity is still low because a part of the pixel circuit is formed in the pixel. There also is a problem that only one of R, G, and B may be read at once and higher speed cannot be easily realized because the pixel circuit has a common part among colors (R, G, and B).

In view of above conventional problems, there is a need to provide a photoelectric conversion element, an image reading device, an image forming apparatus, an image reading method, and an image forming method capable of preventing deterioration in sensitivity.

SUMMARY OF THE INVENTION

It is an object of the present invention to at least partially solve the problems in the conventional technology.

According to the present invention, there is provided a photoelectric conversion element comprising: a plurality of light-receiving elements that generates a charge for each pixel according to an amount of received light; and a plurality of pixel circuits that operates so as to derive the charge generated by the plurality of light-receiving elements from the plurality of light-receiving elements for each pixel, wherein the plurality of light-receiving elements is arranged in a light-receiving area that receives light from outside, and the plurality of pixel circuits is provided in a non-light-receiving area that does not receive the light from outside.

The present invention also provides an image reading device comprising: the above-mentioned photoelectric conversion element, and a control unit that controls such that the plurality of light-receiving elements substantially simultaneously starts generating the charge according to an amount of received light.

The present invention also provides an image forming apparatus comprising: the above-mentioned image reading device, and an image formation unit that forms an image based on an output of the image reading device.

The present invention also provides an image reading method comprising steps of: generating a charge for each pixel according to an amount of received light by each of a plurality of light-receiving elements arranged in a light-receiving area that receives light from outside; and deriving the charge generated by each of the plurality of light-receiving elements from the plurality of light-receiving elements for each pixel by each of a plurality of pixel circuits provided in a non-light-receiving area which does not receive the light from outside.

The present invention also provides an image forming method comprising steps of: generating a charge for each pixel according to an amount of received light by each of a plurality of light-receiving elements arranged in a light-receiving area that receives light from outside; deriving the charge generated by each of the plurality of light-receiving elements from the plurality of light-receiving elements for each pixel by each of a plurality of pixel circuits provided in a non-light-receiving area which does not receive the light from outside, converting the derived charges to generate an image data, and forming an image based on the image data.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 3(a) and 3(b) are diagrams illustrating an operation example of the CMOS area sensor;

FIGS. 8(*a*) and 8(*b*) are diagrams illustrating an operation example of the CMOS linear image sensor;

FIGS. 11(*a*) and 11(*b*) are diagrams illustrating an operation example of the photoelectric conversion element;

DETAILED DESCRIPTION OF THE PREFERRED EMBODIMENTS

Figure 1:
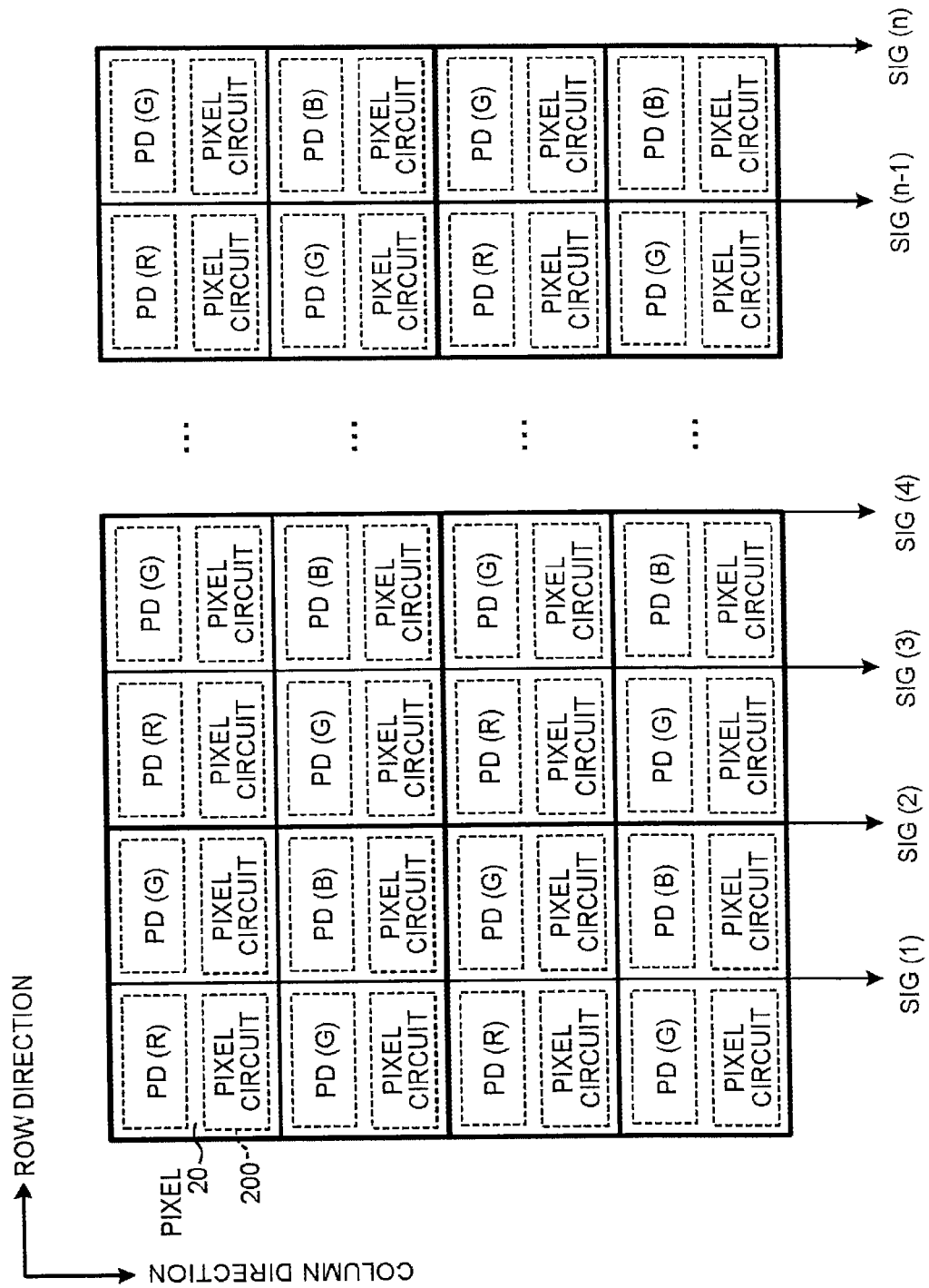
FIG. 1 is a schematic diagram illustrating a configuration of a CMOS area sensor.

The background of the present invention is described first taking a CMOS area sensor in which a CCD image sensor is previously replaced with a CMOS image sensor as an example. FIG. 1 is a schematic diagram illustrating a configuration of a CMOS area sensor 10.

A pixel 20 of the CMOS area sensor 10 includes a photo diode (PD) which performs photoelectric conversion to generate a charge according to an amount of received light and a pixel circuit 200 which operates so as to derive the charge generated by the photo diode through the photoelectric conversion from the photo diode. Specifically, the pixel circuit 200 converts the charge generated by the photo diode to a voltage signal and outputs the same to another circuit at a subsequent stage. The CMOS area sensor 10 is a Bayer pattern area sensor in which four pixels of R, G, G, and B are made one unit.

Figure 2:
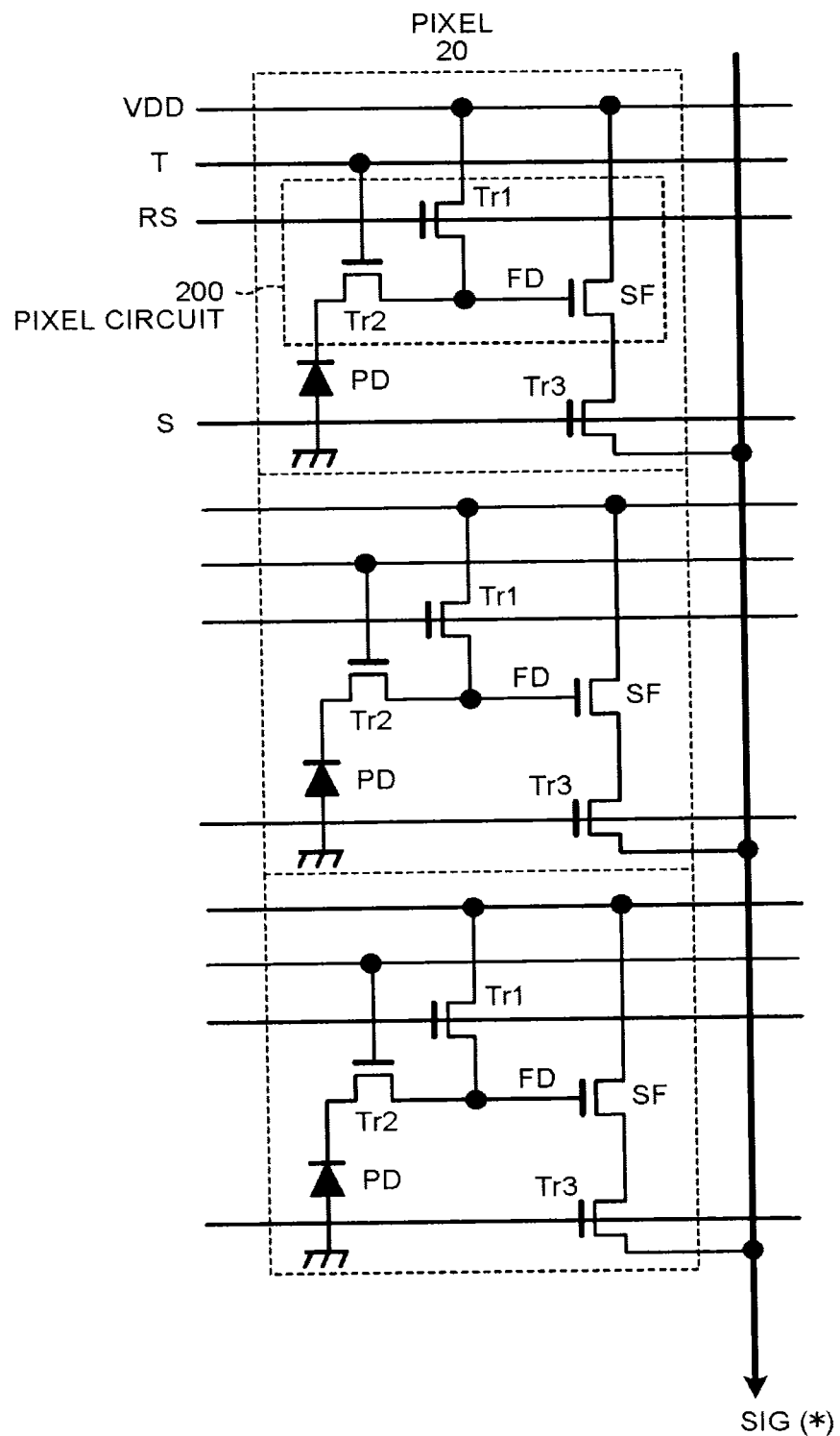
FIG. 2 is a diagram illustrating a configuration of pixels in a column unit of the CMOS area sensor.

FIG. 2 is a diagram illustrating a configuration of the pixels in a column unit of the CMOS area sensor 10 shown in FIG. 1. Hereinafter, the same reference sign is assigned to substantially same component parts. The pixel circuit 200 includes a floating diffusion (FD; charge-voltage conversion unit) which performs charge-voltage conversion of the charge accumulated by PD, a transfer unit (T, Tr2) which transfers the charge to FD, a reset unit (RS, Tr1) which resets potential of FD, a source follower (SF) which buffers the voltage signal of FD to transmit to another circuit at the subsequent stage, and a pixel selection unit (S, Tr3) which selects the pixel. A read line (SIG(*)) from the pixel circuit 200 is shared by the pixel circuits in one column and signals of the pixels 20 are read in a row unit.

At that time, since the pixel circuit 200 is formed in the pixel 20, an area (opening) of PD is limited and sensitivity thereof is deteriorated. Especially, since the pixels are two-dimensionally spread as a configuration of the area sensor, such problematic deterioration in sensitivity is inevitable. Therefore, the opening is secured in the area sensor with an on-chip lens formed for each pixel for collecting light on a PD plane in general; however, this causes an increase in cost and a decrease in yield.

FIGS. 3(*a*) and 3(*b*) are diagrams illustrating an operation example of the CMOS area sensor 10. In the CMOS area sensor 10, the read line from the pixel circuit 200 is shared by the pixel circuits in one column, so that the signals of the pixels 20 are read in the row unit. As shown in FIG. 3(*a*), the signals are read as R→G→R . . . in SIG(1) and G→B→G . . . in SIG(2). The read signals are rearranged by R, G, and B (or R, G, G, and B) to be transmitted to another circuit at the subsequent stage not shown.

FIG. 3(*b*) illustrates operation of the pixel circuit 200. First, the pixel 20 (row) to be read is selected by the pixel selection unit (S is turned ON). In the selected pixel 20, FD is reset (RS is turned ON), then the transfer unit is turned ON (T is turned ON), and the charge of PD is transferred to reset FD. The voltage signal converted by FD is buffered by SF to be output as the signal of SIG(*) through the read line. Thereafter, a next pixel row is selected by the pixel selection unit and read operation is sequentially performed.

Meanwhile, the signal is generally held by a sample hold circuit in SIG; in a case in which correlated double sampling (CDS) is performed, the signal after RS is turned ON (before T is turned ON) is held as a reference level.

Figure 4:
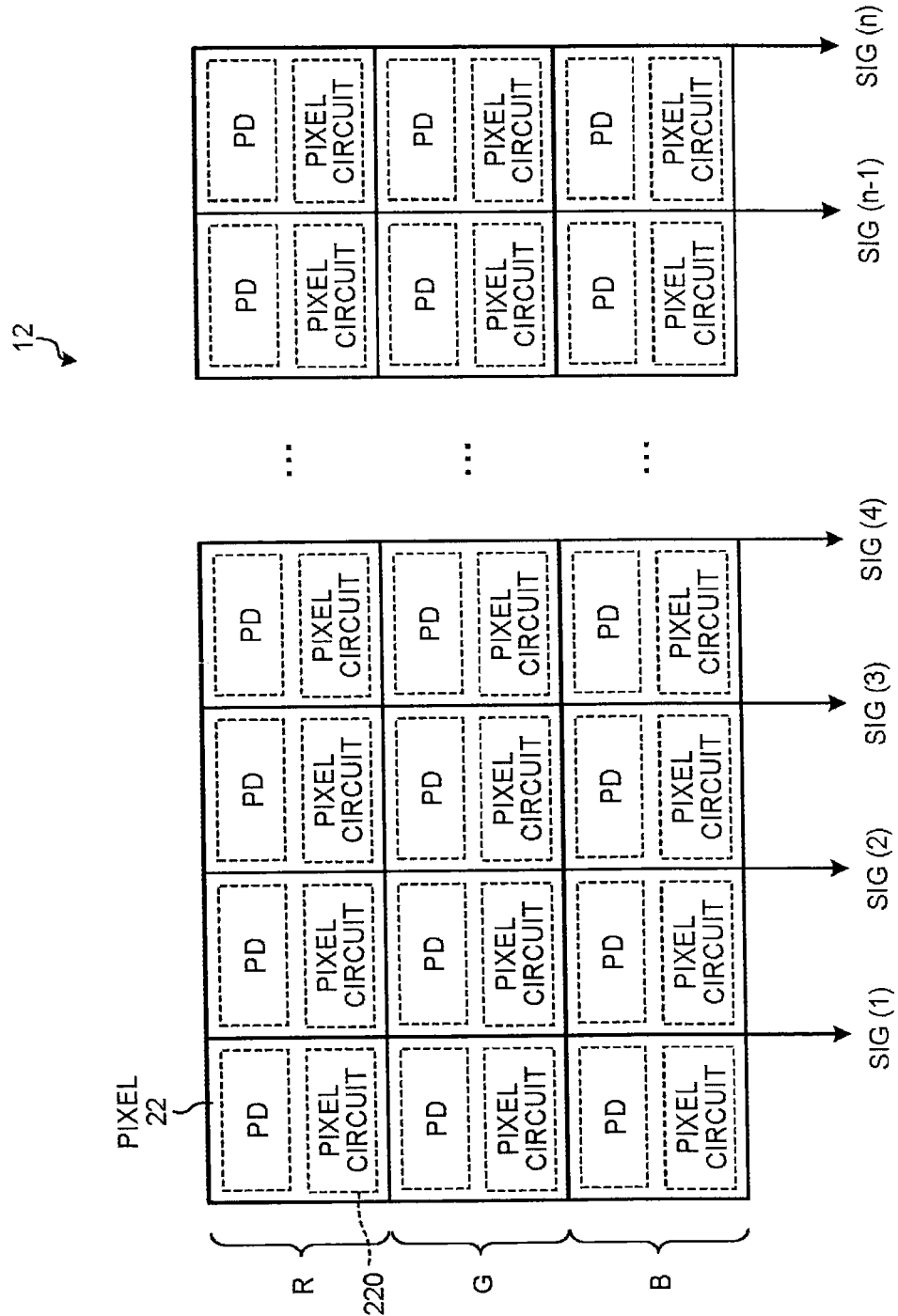
FIG. 4 is a schematic diagram illustrating a first example of a CMOS linear image sensor.

FIG. 4 is a schematic diagram illustrating a configuration of a first example of a CMOS linear image sensor. As shown in FIG. 4, a CMOS linear image sensor 12 is a contact image sensor (CIS), for example, and has a configuration similar to that of the CMOS area sensor 10. The CMOS linear image sensor 12 is different from the CMOS area sensor 10 in that pixels 22 are arranged in one direction for each of R, G, and B colors of light received through a filter not shown. The pixel 22 includes the photo diode (PD) and a pixel circuit 220.

In the CMOS linear image sensor 12, the read line from the pixel circuit 220 is shared by the pixel circuits in one column and signals of the pixels 22 are read in the row unit. That is to say, the CMOS linear image sensor 12 has the read line shared by R, G, and B and the signals are read for each of R, G, and B. Since the CMOS linear image sensor 12 has the configuration similar to that of the CMOS area sensor 10 in this manner, the sensitivity is problematically deteriorated due to the pixel circuit 220.

Figure 5:
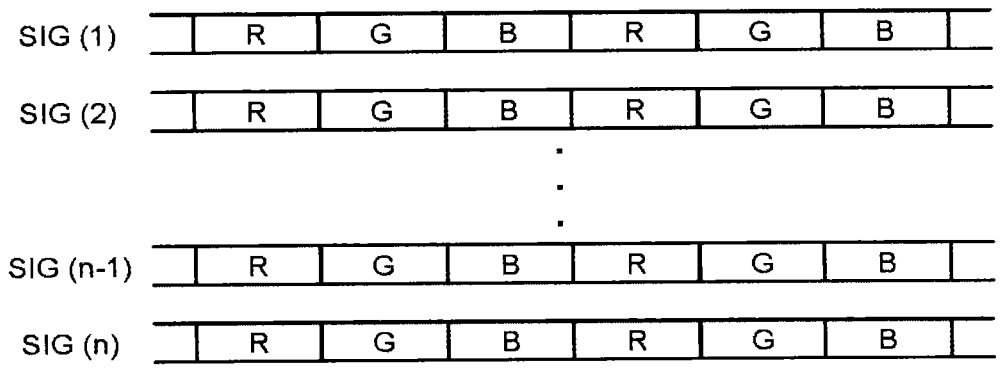
FIG. 5 is a diagram illustrating an operation example of the CMOS linear image sensor.

FIG. 5 is a diagram illustrating an operation example of the CMOS linear image sensor 12. In the CMOS linear image sensor 12, the read line from the pixel circuit 220 is shared by R, G, and B, so that the signals of the pixels 22 are read for each of R, G, and B. At that time, all of SIG(1) to SIG(n) have the same output and the signals are read as R→G→B . . . . Operation of the pixel circuit 220 is similar to the operation shown in FIG. 3(*b*). The CMOS linear image sensor 12 is similar to the CMOS area sensor 10 also in that the signal after RS is turned ON (before T is turned ON) is held as the reference level in a case in which the correlated double sampling (CDS) is performed.

Figure 6:
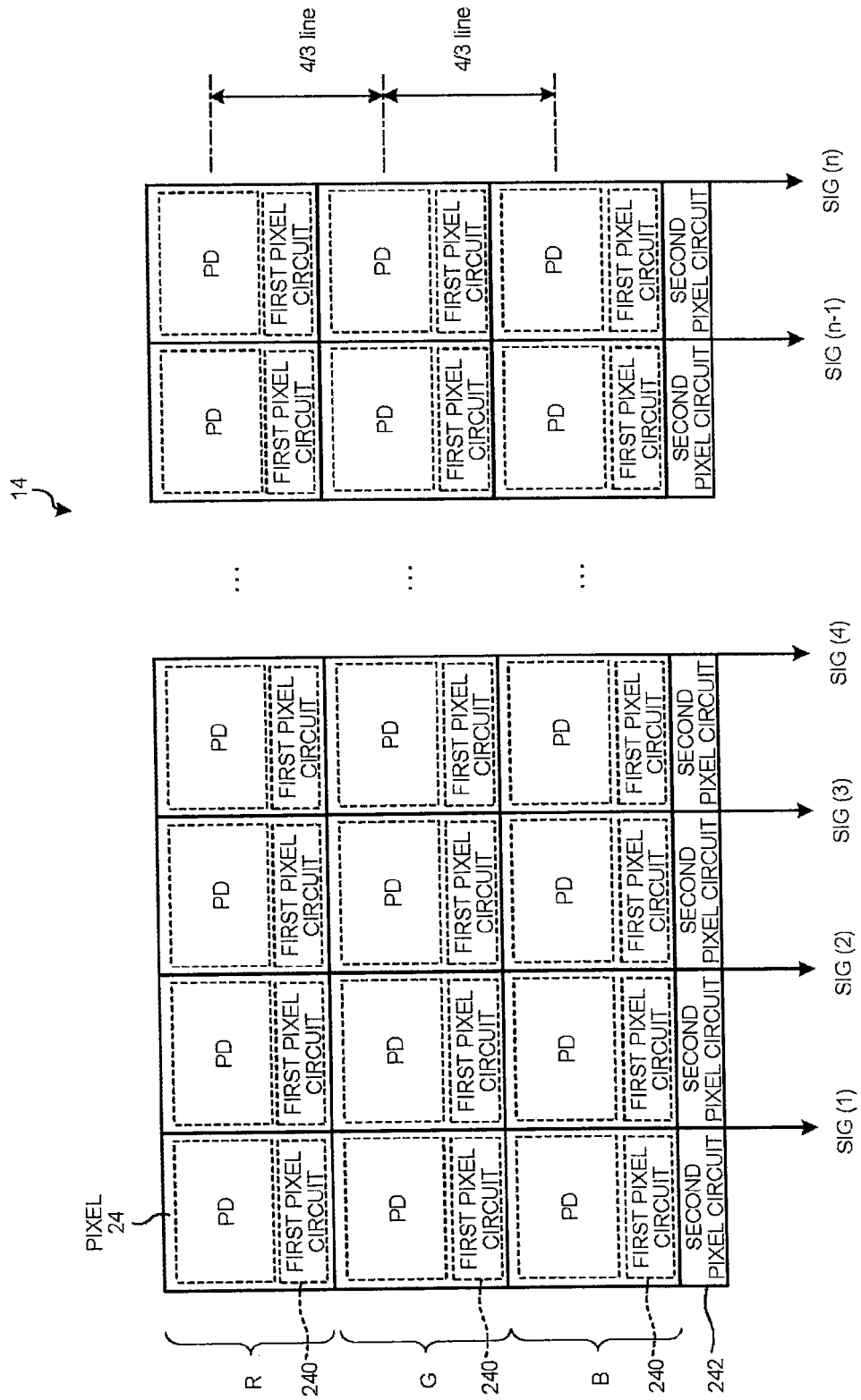
FIG. 6 is a schematic diagram illustrating a second example of the CMOS linear image sensor.
Figure 7:
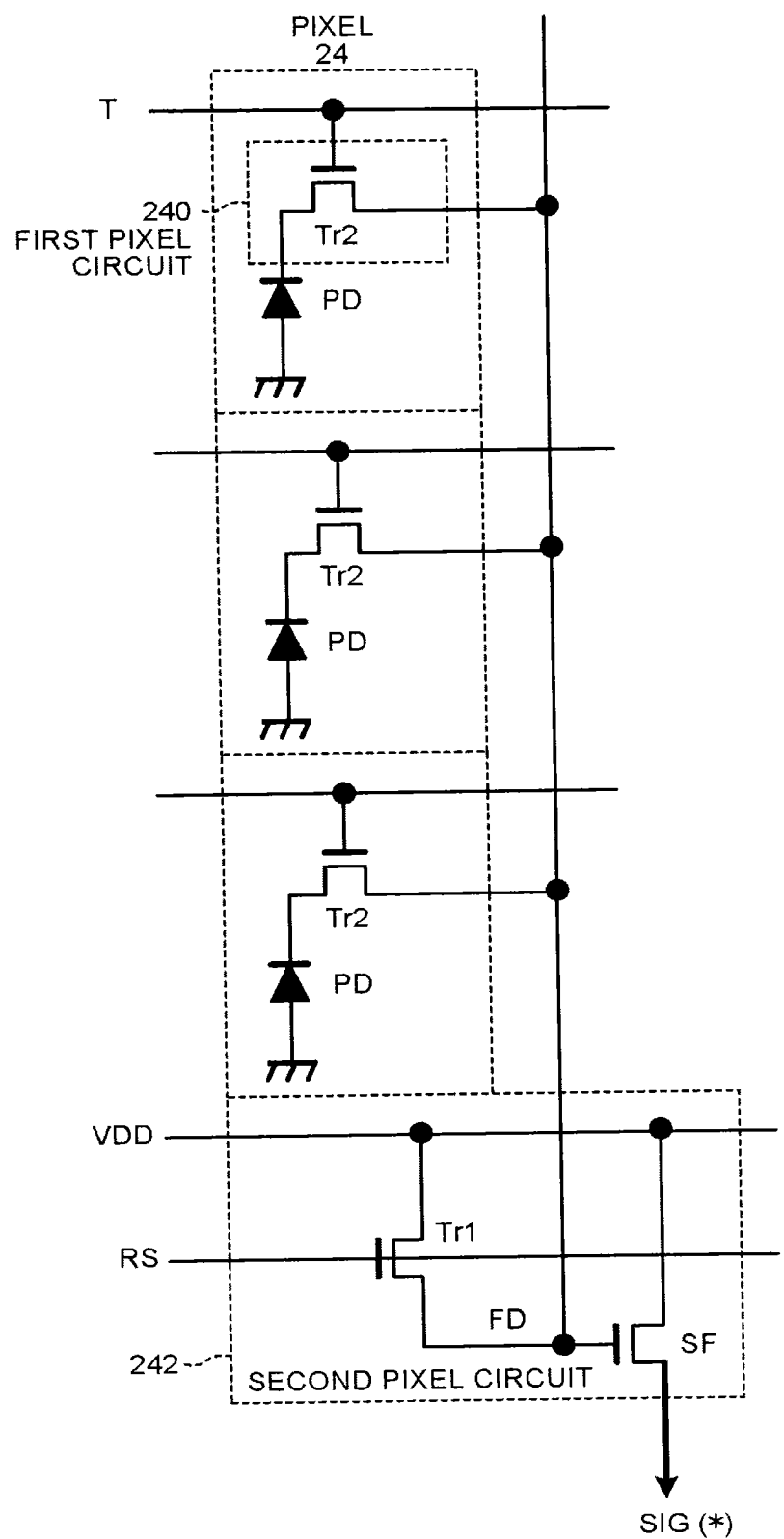
FIG. 7 is a diagram illustrating a configuration of the pixels in the column unit of the second example of the CMOS linear image sensor.

FIG. 6 is a schematic diagram illustrating a configuration of a second example of the CMOS linear image sensor. FIG. 7 is a diagram illustrating a configuration of the pixels in the column unit of the second example of the CMOS linear image sensor shown in FIG. 6. As shown in FIG. 6, in a CMOS linear image sensor 14, the pixel circuit shared by the pixels and the pixel circuit not shared by the pixels are separately provided and the shared pixel circuit is arranged outside the pixel in order to reduce the deterioration in sensitivity by the pixel circuit.

That is to say, as shown in FIG. 6, in the CMOS linear image sensor 14, the pixel circuit is divided into an independent circuit for each pixel (first pixel circuit 240) and a circuit shared by the R, G, and B pixels 24 (second pixel circuit 242). The first pixel circuit 240 includes up to the transfer unit (Tr2, T). The second pixel circuit 242 includes up to the floating diffusion (FD), the reset unit (Tr1, RS), and the source follower (SF) as the pixel circuit shared by R, G, and B. The CMOS linear image sensor 14 is the same as the CMOS linear image sensor 12 in that the read line is shared by R, G, and B. Meanwhile, in the CMOS linear image sensor 14, a pitch of R, G, and B pixel rows equals to ⁴⁄₃ line (four-thirds of a pixel sub-scanning size).

In the CMOS linear image sensor 14, the area of the photo diode (PD) may be increased because of a small pixel circuit formed in the pixel 24; however, a part of the pixel circuit (first pixel circuit 240) is left in the pixel 24, so that it cannot be said that the sensitivity is sufficiently improved. Specifically, a sub-scanning size of PD is set to three-quarters of a square area of the pixel 24 and the first pixel circuit 240 is arranged in a remaining one-quarter area. That is to say, this means that one-quarter of the PD area is cut by the first pixel circuit 240, so that a situation in which the area of PD is limited by the pixel circuit is left unchanged. Namely, the CMOS linear image sensor 14 still has a room for improvement in sensitivity and the pixel area is not efficient.

Meanwhile, even in a case of the CMOS linear image sensor, a pixel size of the contact image sensor (CIS) is large by its nature, so that there is substantially no effect of inefficiency with the configuration of the CMOS linear image sensor 14 shown in FIG. 6. On the other hand, in the CMOS linear image sensor for reduction optical system having the pixel size not larger than one-tenth of that of CIS, an effect by the first pixel circuit 240 is large and the sensitivity is not yet sufficient with the configuration of the CMOS linear image sensor 14. This is because the effect of the pixel circuit becomes relatively large as the area of PD is smaller due to the substantially same size of the pixel circuit with different pixel sizes. Since the second pixel circuit 242 is shared by R, G, and B in the configuration of the CMOS linear image sensor 14, only one of R, G, and B may be read at once (linear sequential reading). Therefore, there is a problem that high-speed read operation cannot be realized with the configuration of the CMOS linear image sensor 14.

FIGS. 8(a) and 8(b) are diagrams illustrating an operation example of the CMOS linear image sensor 14. As shown in FIG. 8(a), the pixels of the CMOS linear image sensor 14 are read in the same manner as that of the CMOS linear image sensor 12. In this case also, the read line from the second pixel circuit 242 is shared by R, G, and B, so that the signals of the pixels 24 are read for each of R, G, and B.

As shown in FIG. 8(b), operation of the first pixel circuit 240 and that of the second pixel circuit 242 are different from the operation shown in FIG. 3(b) in that the transfer unit (Tr2, T) also serves as the pixel selection unit. Therefore, in the CMOS linear image sensor 14, the pixel row to be read is selected by charge transfer units sequentially turned ON such as R→G→B . . . . In the CMOS linear image sensor 14, the operation is similar to that shown in FIG. 3(b) also in that the signal after RS is turned ON (before T is turned ON) is held as the reference level in a case in which the correlated double sampling (CDS) is performed.

Although the sensitivity is improved in the CMOS linear image sensor 14, the first pixel circuit 240 is left in the pixel 24, so that it cannot be said that the improvement in sensitivity is sufficient. This is because there is the second pixel circuit 242 shared by R, G, and B, that is to say, because of a linear sequential reading configuration. Namely, in a case of the linear sequential reading, it is required to read the image signals of R, G, and B three colors within one-line period, so that they are read in time-division manner; however, color shift occurs because different positions are read among R, G, and B due to different read timings among R, G, and B. Therefore, it is not possible to enlarge the pitch of the R, G, and B pixel rows and an area in which the pixel circuit is arranged cannot be secured, so that the area of PD must be cut. Each of R, G, and B colors is read in the linear sequential reading, so that an increase in speed cannot be realized.

Embodiment

Figure 9:
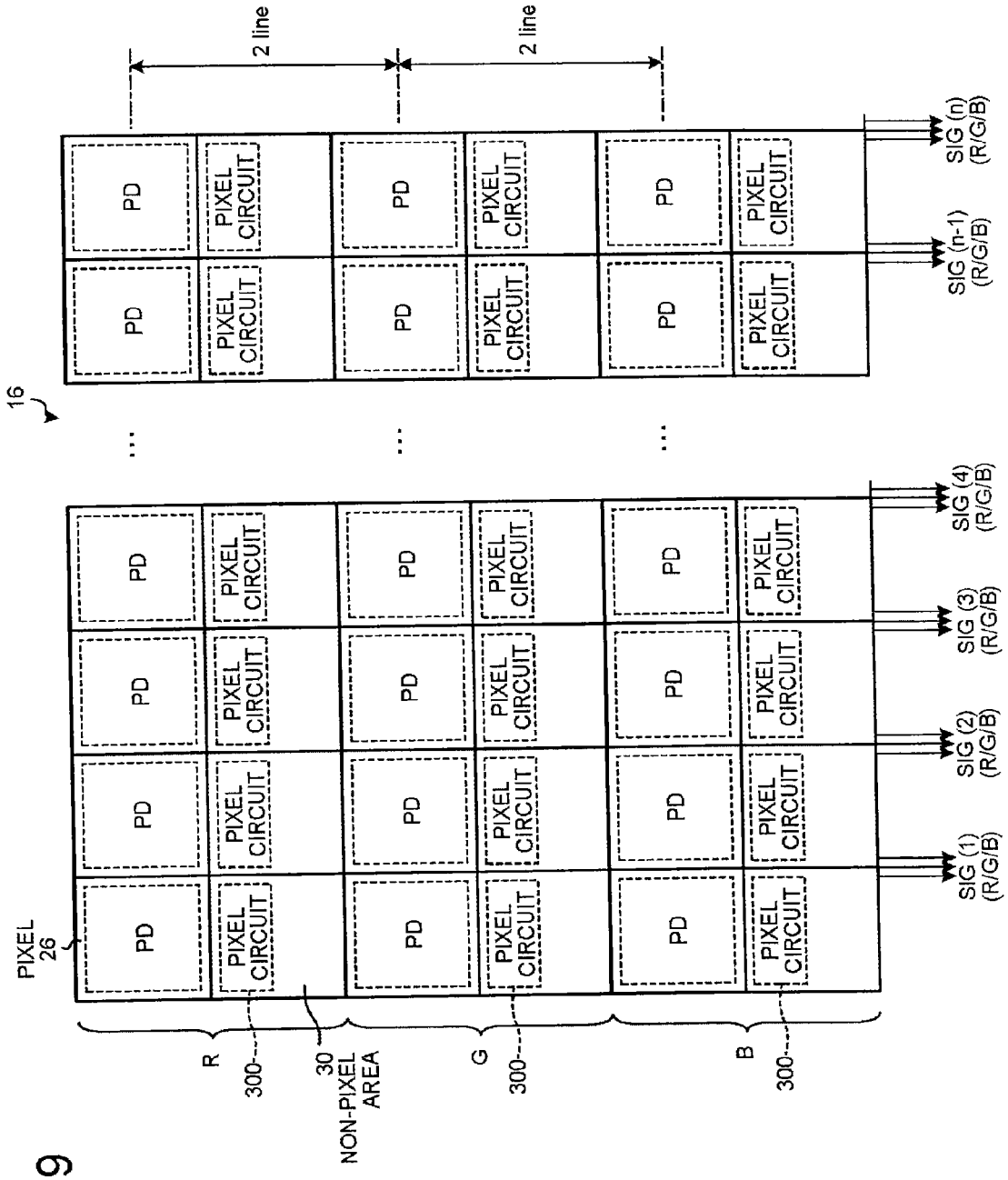
FIG. 9 is a diagram illustrating an outline of a configuration of a photoelectric conversion element according to an embodiment.
Figure 10:
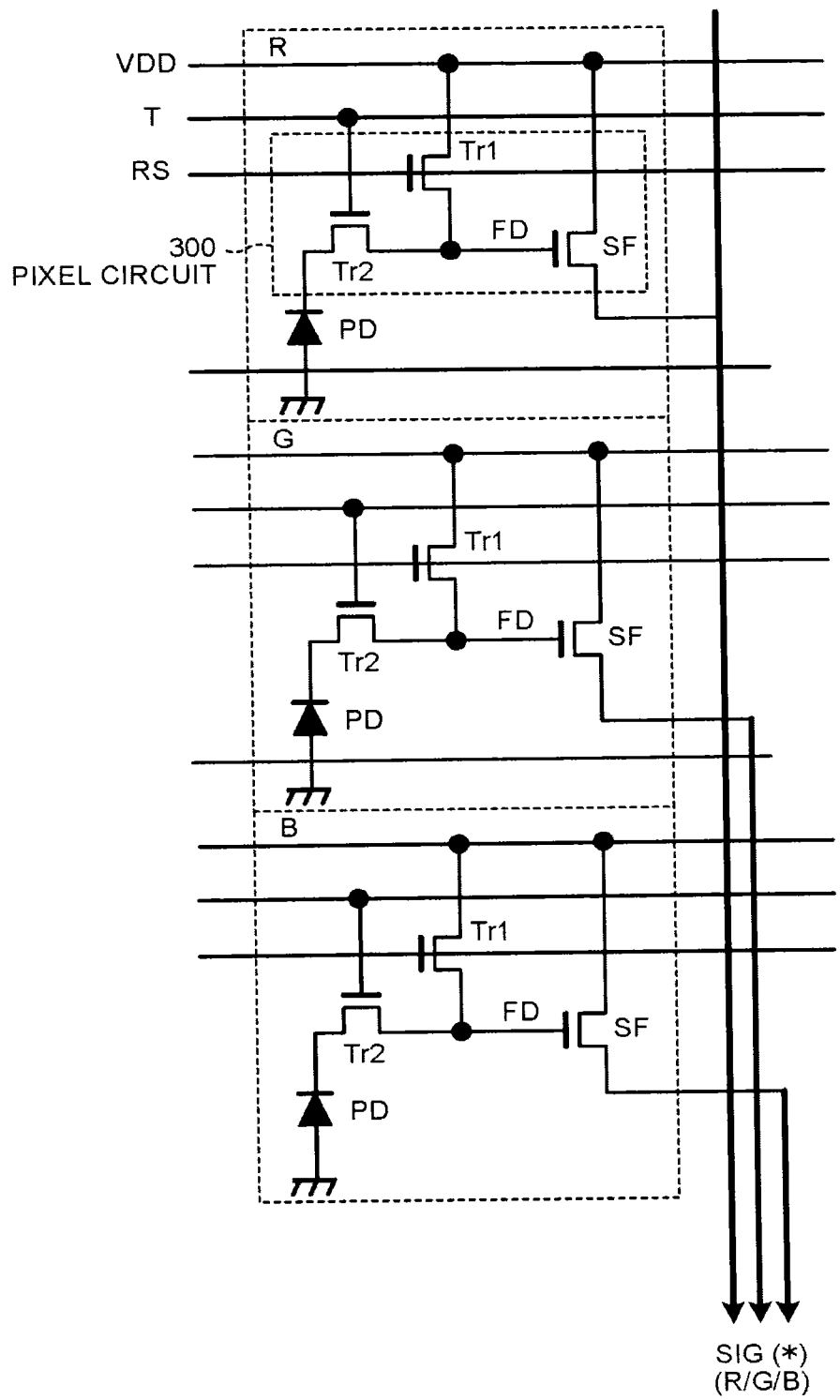
FIG. 10 is a diagram illustrating a configuration of the pixels in the column unit of the photoelectric conversion element illustrated in FIG. 9.

Next, an embodiment of a photoelectric conversion element is described in detail. FIG. 9 is a diagram illustrating an outline of a configuration of a photoelectric conversion element 16 according to the embodiment. FIG. 10 is a diagram illustrating a configuration of pixels in a column unit of the photoelectric conversion element 16 shown in FIG. 9. The photoelectric conversion element 16 is a CMOS linear color image sensor without an on-chip lens provided, for example. In the photoelectric conversion element 16, n pixels 26 are arranged in one direction for each of R, G, and B colors of light received through a filter (not shown).

In each pixel 26, a light-receiving element (photo diode (PD)) which generates a charge according to an amount of received light is provided so as to occupy a substantially entire area except a separating zone to be described later. A plurality of pixels 26 is arranged in one direction for each color of the received light to form three pixel rows of R, G, and B. Each of the three pixel rows is provided in a light-receiving area which receives light from outside.

In the photoelectric conversion element 16, a non-pixel area 30 is provided for each pixel along each pixel row so as to be adjacent thereto. The non-pixel area 30 is a non-light-receiving area which does not receive the light from outside. In the non-pixel area 30, a pixel circuit 300 which operates so as to derive the charge generated by PD from PD for each pixel is provided. The pixel circuit 300 includes a floating diffusion (FD; charge-voltage conversion unit) which performs charge-voltage conversion of the charge accumulated by PD, a transfer unit (T, Tr2) which transfers the charge generated by PD to FD, a reset unit (RS, Tr1) which resets potential of FD, and a source follower (SF; transmission unit) which buffers a voltage signal of FD to transmit to another circuit at a subsequent stage. Each of the n pixel circuits 300 independently outputs the signal of the pixel 26 to another circuit at the subsequent stage.

That is to say, the photoelectric conversion element 16 may simultaneously read reflected light of R, G, and B and it is possible to enlarge a pitch of the R, G, and B pixel rows as compared to a case of linear sequential reading. For example, the ⁴⁄₃-line pitch in the CMOS linear image sensor 14 shown in FIG. 6 is enlarged to a two-line pitch in the photoelectric conversion element 16. Namely, the photoelectric conversion element 16 is formed such that the non-pixel area 30 having an area equivalent to a size of the pixel 26 (sufficient for an area of the pixel circuit) is adjacent to the pixel row, so that it is not required to divide the pixel circuit into a shared part and a non-shared part and it is possible to arrange an entire pixel circuit in the non-pixel area for each pixel. Meanwhile, in the photoelectric conversion element 16, the signal may be independently read for each pixel, so that a pixel selection unit is not required.

In this manner, in the photoelectric conversion element 16, PD occupies the area in the pixel 26 (except the separating zone to be described later). That is to say, in the photoelectric conversion element 16, a PD area in the pixel (or the light-receiving area) may be maximized, so that sensitivity is maximized. Since the photoelectric conversion element 16 may independently read the signal of each of the R, G, and B pixels 26, high-speed read operation may be realized (this may simply be three or more times faster than that by a linear sequential reading method).

FIGS. 11(a) and 11(b) are diagrams illustrating an operation example of the photoelectric conversion element 16. The photoelectric conversion element 16 has an independent read line from the pixel circuit 300 for each pixel 26, so that R, G, and B signals, for example, of the pixels 26 are simultaneously read. Although the operation of the CMOS linear image sensor 14 shown in FIG. 8(b) is sequential operation of R, G, and B, each pixel circuit 300 operates at the same timing on each pixel 26. The photoelectric conversion element 16 is similar to the CMOS linear image sensor 14 in that the signal after RS is turned ON (before T is turned ON) is held as a reference level in a case in which correlated double sampling (CDS) is performed.

Figure 12:
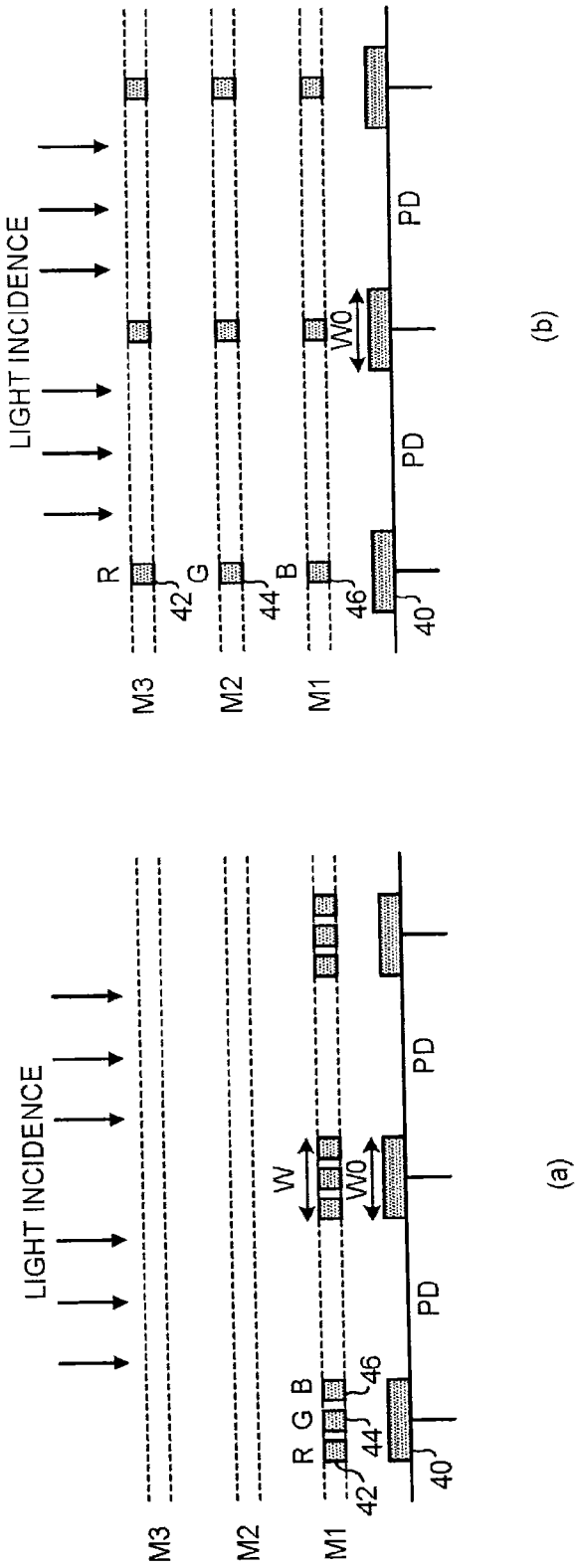
FIGS. 12(*a*) and 12(*b*) are cross-sectional schematic diagrams illustrating the photoelectric conversion element illustrating a position of a signal line which transmits a signal output from a pixel circuit to another circuit.

FIGS. 12(a) and 12(b) are cross-sectional schematic diagrams of the photoelectric conversion element 16 illustrating a position of a signal line (output signal line) which transmits the signal output from the pixel circuit 300 to another circuit. In the CMOS linear image sensor for reduction optical system, there is a case in which a ratio of an area in which the signal line (wiring) is arranged relative to an area in which PD is arranged becomes larger than that of CIS. In the photoelectric conversion element 16, a width in which R, G, and B signal lines output from the pixel circuit 300 are arranged is set to be not larger than a width of a separating zone (pixel separating zone) 40 which separates the adjacent pixels (PDs) in the pixel row.

Specifically, as shown in FIG. 12(a), in the photoelectric conversion element 16, when a width of the separating zone 40 in a main-scanning direction is set to WO and a width in which an R signal line 42, a G signal line 44, and a B signal line 46 are arranged is set to W, W≤WO is satisfied. According to this, in the photoelectric conversion element 16, limitation of an opening of PD by the signal line from the pixel circuit 300 is prevented. Meanwhile, M1 to M3 in FIGS. 12(a) and 12(b) represent wiring layers. That is to say, in FIG. 12(a), an example of a case in which the photoelectric conversion element 16 has a three-layered wiring structure is illustrated. In this manner, the output signal line which transmits the signal output from the pixel circuit 300 to another circuit is formed on the wiring layer on which the separating zone 40 which separates PDs in the pixel row is not arranged and is arranged within a range overlapped with the separating zone 40.

When a plurality of signal lines is adjacently arranged, if a gap between the signal lines is small, false color might be generated by cross talk between colors. Therefore, in the photoelectric conversion element 16, the signal lines may also be arranged on different wiring layers for each pixel row as shown in FIG. 12(b). Due to this configuration, in the photoelectric conversion element 16, the cross talk between the colors by the signal lines is prevented and the limitation of the opening of PD by the signal line from the pixel circuit 300 is prevented. Meanwhile, it is not necessarily required that the positions of the R, G, and B signal lines in the main-scanning direction coincide with one another at the center of the separating zone 40 as shown in FIG. 12(b), they are desirably arranged as shown in FIG. 12(b) from a viewpoint of a risk of deterioration in sensitivity and symmetry of a characteristics.

Figure 13:
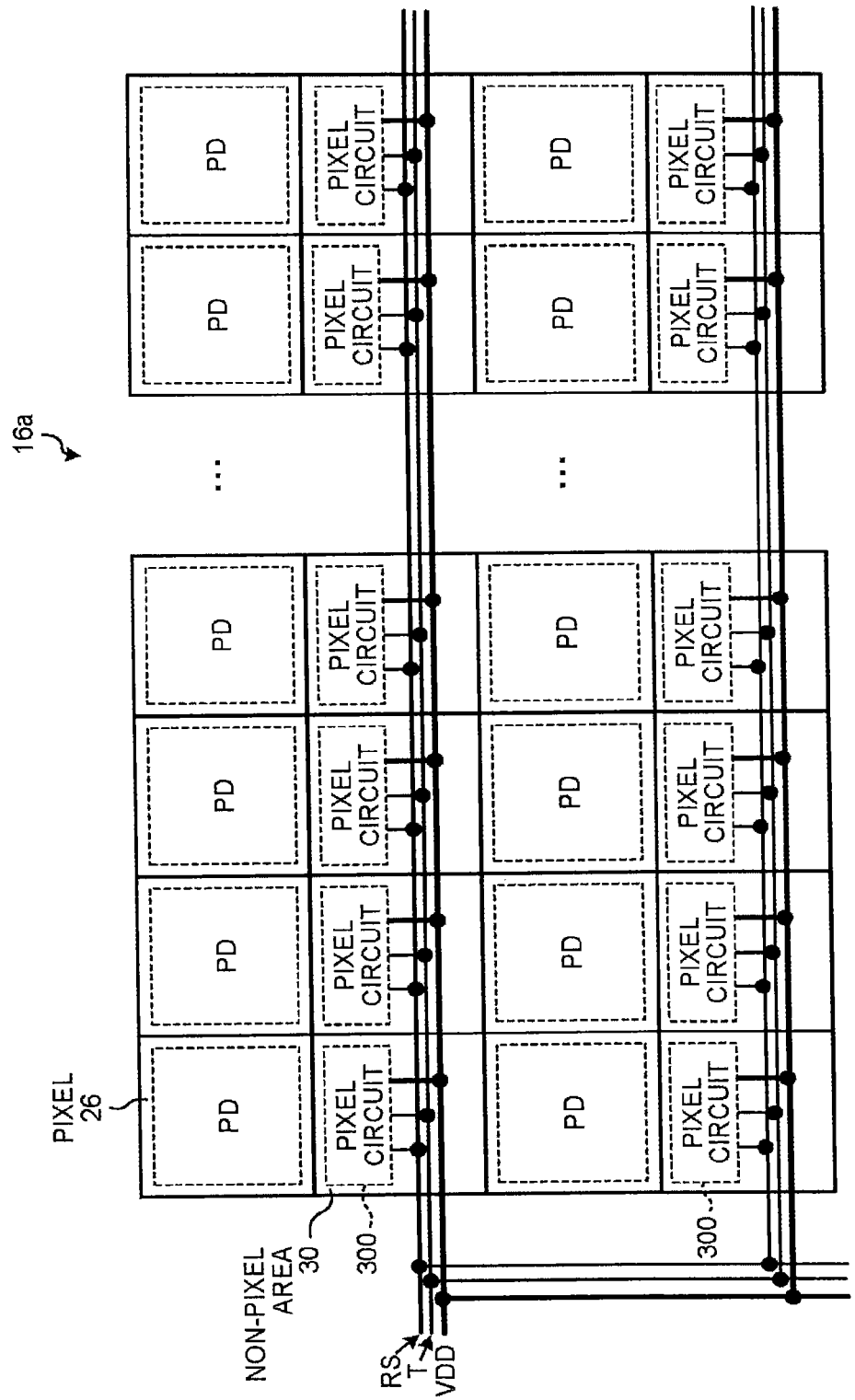
FIG. 13 is a schematic diagram illustrating a first example of the photoelectric conversion element.

FIG. 13 is a schematic diagram illustrating a first example of the photoelectric conversion element 16 (photoelectric conversion element 16a). In the photoelectric conversion element 16, not only the signal line which transmits the signal output from the pixel circuit 300 but also a control line (control signal line) which transmits a control signal to control the pixel circuit 300 might limit the opening of PD.

In the photoelectric conversion element 16a, the control line to the pixel circuit 300 is arranged in the non-light-receiving area such as the non-pixel area 30. Thereby, in the photoelectric conversion element 16a, the control line to the pixel circuit 300 is prevented from limiting the opening of PD.

In FIG. 13, although the control line is indicated by three lines of RS, T, and VDD (power source line), a plurality of lines is actually present, so that a wiring space cannot be ignored. Therefore, in the photoelectric conversion element 16a, the control line to the pixel circuit 300 is shared by at least the pixel circuits of the same pixel row. Thereby, in the photoelectric conversion element 16a, a scale of the control line is minimized and the limitation of the opening of PD is prevented.

Further, in the photoelectric conversion element 16a, the control line to the pixel circuit 300 is shared by the pixel rows (R, G, and B). Due to this configuration, simultaneous exposure (global shutter) in which exposure timings of R, G, and B are matched is realized in the photoelectric conversion element 16a, so that the color shift may be prevented. Meanwhile, in FIG. 13, the control line is shared by R, G, and B, so that simultaneous exposure timing is realized; the same effect is obtained by independently forming the control lines for R, G, and B and using the control signals at the same timing.

Figure 14:
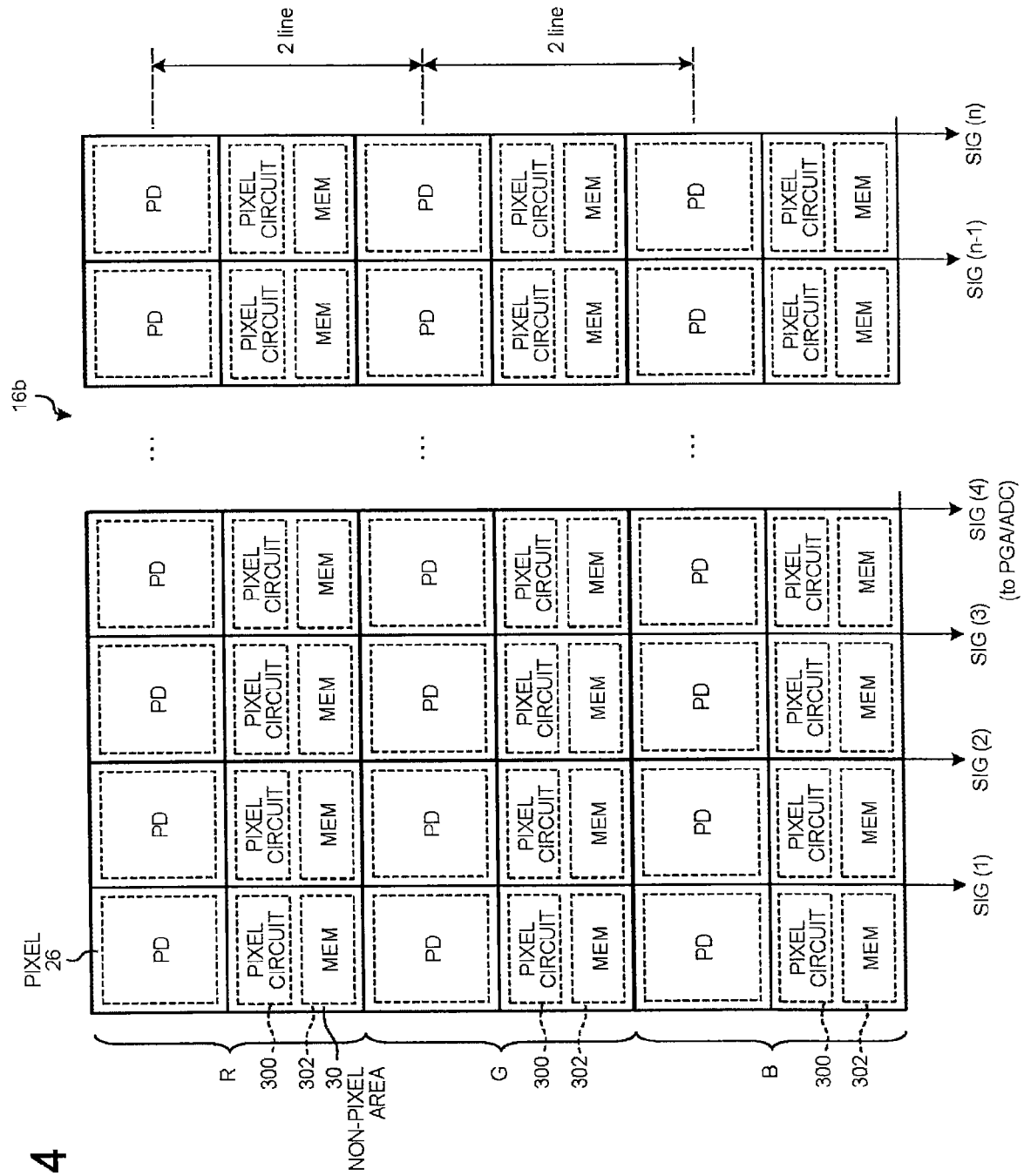
FIG. 14 is a schematic diagram illustrating a second example of the photoelectric conversion element.
Figure 15:
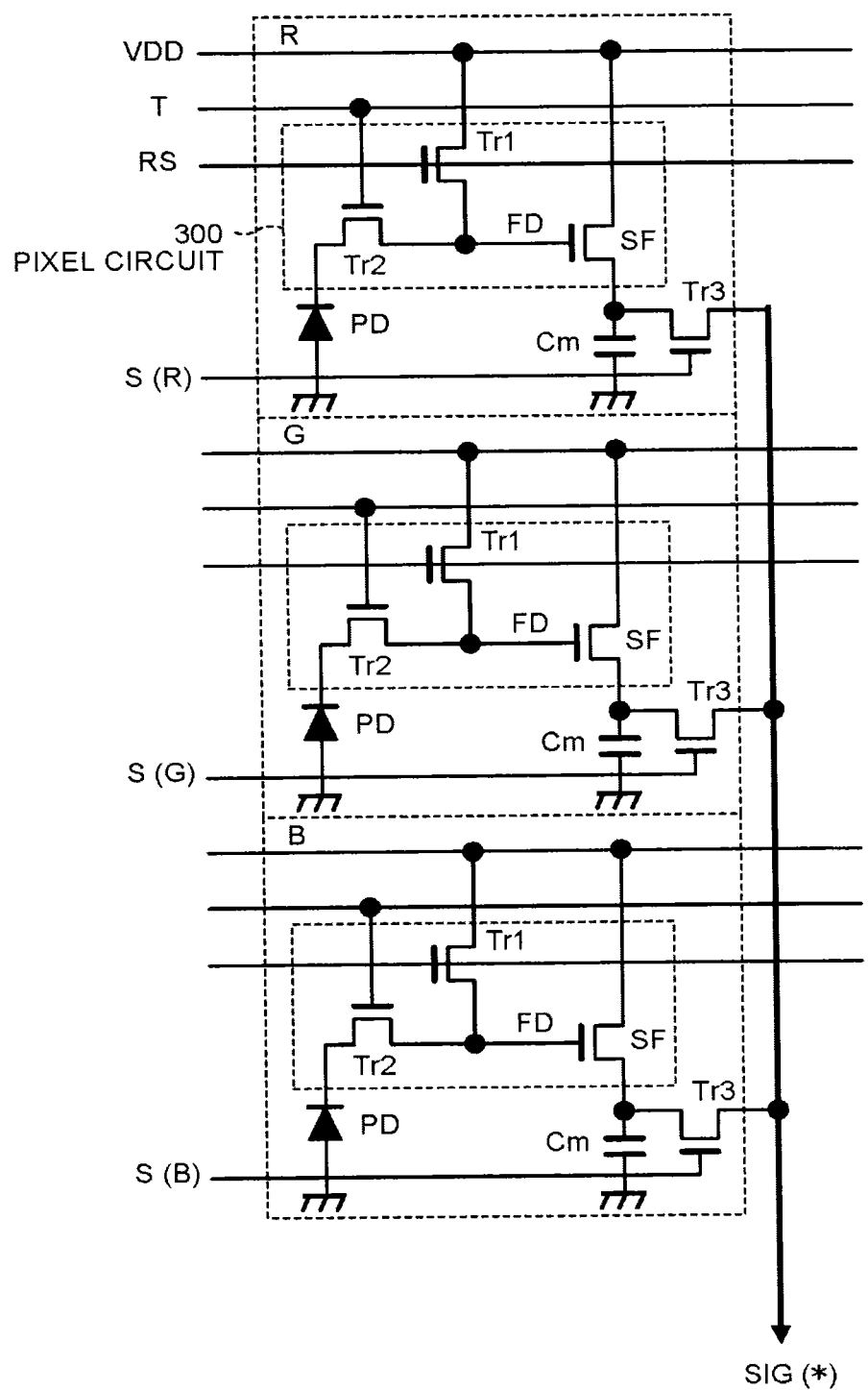
FIG. 15 is a diagram illustrating a configuration of the pixels in the column unit of the photoelectric conversion element.

FIG. 14 is a schematic diagram illustrating a second example of the photoelectric conversion element 16 (photoelectric conversion element 16b). FIG. 15 is a diagram illustrating a configuration of the pixels in the column unit of the photoelectric conversion element 16b shown in FIG. 14. When the photoelectric conversion element 16 is the CMOS linear color image sensor, this may include a logic circuit embedded therein, so that this might be provided with a programmable gain amplifier (PGA) and an analog-digital converter (ADC) at a subsequent stage of the pixel circuit 300 to read an image with high accuracy and low noise. There also is a case in which the photoelectric conversion element 16 is provided with PGA and ADC for each pixel for higher speed, a circuit scale becomes larger in this case.

The photoelectric conversion element 16b includes the pixel circuit 300 and an analog memory 302 (MEM, Cm) in the non-pixel area 30 for each pixel as shown in FIGS. 14 and 15. The analog memory Cm is connected to the subsequent stage of the pixel circuit 300 to temporarily hold the output of the pixel circuit 300. A switch at a subsequent stage of the analog memory Cm is a pixel selection unit (S, Tr3) being a selection switch for sequentially outputting R, G, and B outputs to PGA and ADC.

Therefore, the photoelectric conversion element 16b may temporarily hold the signal output from the pixel circuit 300 in the analog memory Cm, so that it becomes possible that PGA and ADC which might be arranged at the subsequent stage of the pixel circuit 300 are shared. That is to say, the photoelectric conversion element 16b enables serial processing by PGA and ADC and enables independent processing of each of R, G, and B signals by the same circuit, so that it becomes possible to suppress the circuit scale. Meanwhile, the photoelectric conversion element 16b is provided with the pixel selection unit to sequentially transmit the R, G, and B signals to another circuit at the subsequent stage, so that a signal read line is shared by R, G, and B.

Figure 16:
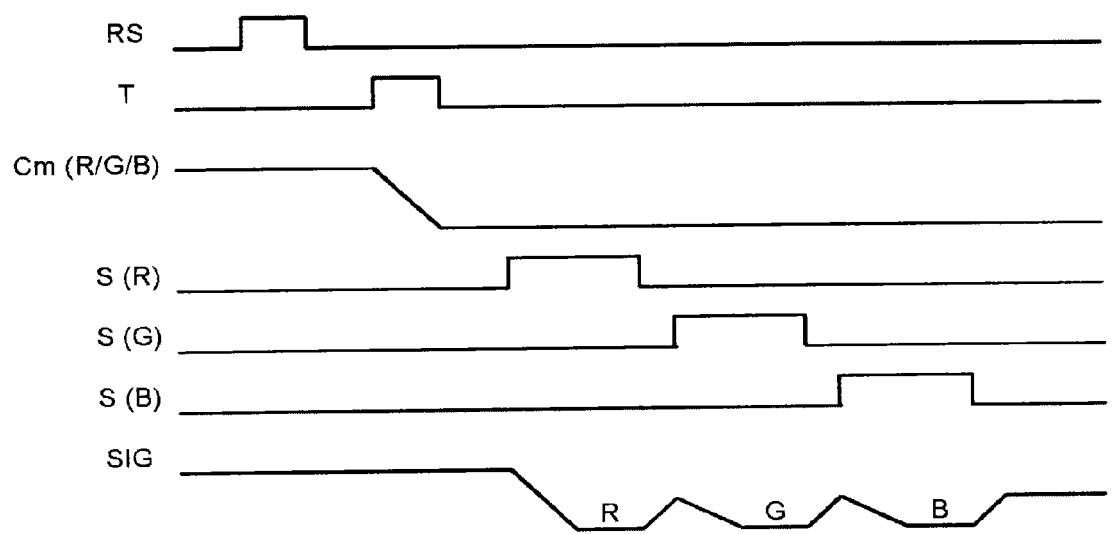
FIG. 16 is a diagram illustrating an operation example of the photoelectric conversion element.

FIG. 16 is a diagram illustrating an operation example of the photoelectric conversion element 16b. Operation of the pixel circuit 300 is similar to the operation shown in FIG. 8(b). In the photoelectric conversion element 16b, the signals output from the pixel circuits 300 are temporarily held in the analog memories Cm((*)) for each of R, G, and B. Next, when R, G, and B pixel selection signals (S(*)) are sequentially turned ON, the signals held in the analog memories Cm((*)) are read into the signal read line (SIG) shared by R, G, and B to be output to PGA and ADC (not shown) at the subsequent stage.

In the photoelectric conversion element 16b, when the correlated double sampling (CDS) is performed, the signal after RS is turned ON (before T is turned ON) may be held as the reference level. In this case, however, the photoelectric conversion element 16b is required to be further provided with the analog memory Cm using for the reference level.

Figure 17:
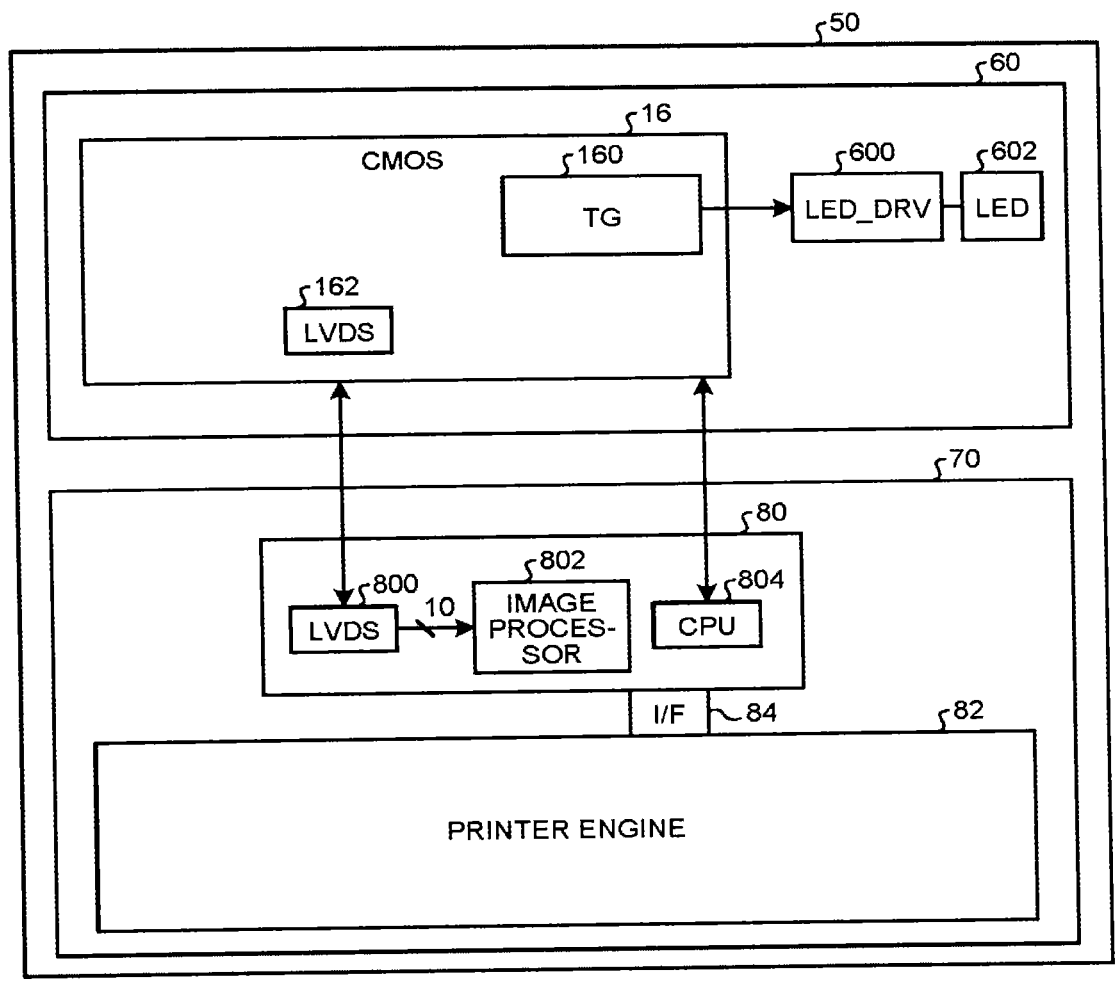
FIG. 17 is a schematic diagram illustrating an image forming apparatus provided with an image reading device including the photoelectric conversion element.

Next, an image forming apparatus provided with an image reading device including the photoelectric conversion element 16 is described. FIG. 17 is a schematic diagram of an image forming apparatus 50 provided with an image reading device 60 including the photoelectric conversion element 16. The image forming apparatus 50 is a copy machine, a multi-function peripheral (NFP) and the like, for example, including the image reading device 60 and an image formation unit 70.

The image reading device 60 includes the photoelectric conversion element 16, an LED driver (LED_DRV) 600, and an LED 602, for example. The LED driver 600 drives the LED 602 in synchronization with a line synchronization signal output from a timing control unit (TG) 160. The LED 602 irradiates a document with light. The photoelectric conversion element 16 receives reflected light from the document in synchronization with the line synchronization signal and the like and a plurality of light-receiving elements (PDs)(not shown) generates the charge and starts accumulating. Then, the photoelectric conversion element 16 outputs image data to the image formation unit 70 by an LVDS 162 after performing AD conversion, parallel-serial conversion and the like.

The image formation unit 70 includes a processor 80 and a printer engine 82 and the processor 80 and the printer engine 82 are connected to each other through an interface (I/F) 84.

The processor 80 includes an LVDS 800, an image processor 802, and a CPU 804. The CPU 804 controls each unit forming the image forming apparatus 50 such as the photoelectric conversion element 16. The CPU 804 (or the timing control unit 160) controls such that each PD substantially simultaneously starts generating the charge according to the amount of received light.

The LVDS 162 outputs the image data of an image read by the image reading device 60, the line synchronization signal, transmission clock and the like, for example, to the LVDS 800 at a subsequent stage. The LVDS 800 converts the received image data, line synchronization signal, transmission clock and the like to parallel 10-bit data. The image processor 802 performs image processing using the converted 10-bit data and outputs the image data and the like to the printer engine 82. The printer engine 82 prints by using the received image data.

The present invention has an effect that the deterioration in sensitivity may be prevented.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A photoelectric conversion element comprising:
  a light-receiving area that receives light from outside;
  a plurality of pixels that are arranged to form one or more pixel rows in the light-receiving area;
  a non-light-receiving area that does not receive the light from outside, and that is provided so as to be adjacent to the light-receiving area;
  a plurality of light-receiving elements each provided respectively in each of the pixels, and that generates a charge for each of the pixels according to an amount of received light; and
  a plurality of pixel circuits each arranged so as to be respectively adjacent to each of the pixels in the non-light-receiving area, and operates respectively so as to derive the charge generated by each of the plurality of light-receiving elements.

2. The photoelectric conversion element according to claim 1, wherein
  each of the pixel circuits includes:
  a transfer unit that transfers the charge generated by a light-receiving element for each pixel;
  a charge-voltage conversion unit that converts the charge transferred by the transfer unit to a voltage;
  a reset unit that resets potential of the charge-voltage conversion unit; and
  a transmission unit that transmits the voltage converted by the charge-voltage conversion unit to another circuit.

3. The photoelectric conversion element according to claim 1, wherein
  the plurality of light-receiving elements is arranged in one direction for each color of received light to form the one or more pixel rows, and
  the non-light-receiving area is provided for each of the pixel rows along the pixel row so as to be adjacent to the pixel row.

4. The photoelectric conversion element according to claim 3, further comprising a control signal line that transmits a control signal for controlling the pixel circuit, wherein
  the control signal line is shared by the light-receiving elements in the pixel row.

5. The photoelectric conversion element according to claim 4, wherein
  the control signal line is shared by the pixel rows.

6. The photoelectric conversion element according to claim 4, wherein
  the control signal line is formed in the non-light-receiving area.

7. The photoelectric conversion element according to claim 3, further comprising an output signal line that transmits a signal output from the pixel circuit to another circuit, wherein
  the output signal line is formed on a wiring layer on which a separating zone that separates the light-receiving elements in the pixel row is not arranged, and the output signal line is arranged within a range overlapped with the separating zone.

8. The photoelectric conversion element according to claim 7, wherein
  output signal lines are formed on different wiring layers for each of the pixel rows.

9. The photoelectric conversion element according to claim 7, wherein
the output signal lines are independently formed for each of the pixel circuits.

10. The photoelectric conversion element according to claim 1, wherein
the pixel circuit outputs a signal through an analog memory.

11. An image reading device comprising:
the photoelectric conversion element according to claim 1, and
a control unit that controls such that the plurality of light-receiving elements substantially simultaneously starts generating the charge according to an amount of received light.

12. An image forming apparatus comprising:
the image reading device according to claim 11, and
an image formation unit that forms an image based on an output of the image reading device.

13. An image reading method comprising steps of:
generating a charge for each of a plurality of pixels according to an amount of received light by each of a plurality of light-receiving elements that are each provided respectively in each of the pixels and arranged in a light-receiving area that receives light from outside, the plurality of pixels being arranged to form a pixel row in the light-receiving area; and
deriving the charge generated by each of the plurality of light-receiving elements by each of a plurality of pixel circuits that are each arranged so as to be respectively adjacent to each of the pixels provided in a non-light-receiving area, the non-light receiving area not receiving the light from outside and being provided so as to be adjacent to the light-receiving area.

14. The image reading method according to claim 13, further comprising a step of transmitting a signal output from each of the pixel circuits by an output signal line independently formed for each of the pixel circuits to another circuit.

15. The image reading method according to claim 13, further comprising a step of outputting a signal from each of the pixel circuits through an analog memory.

16. An image forming method comprising steps of:
generating a charge for each of a plurality of pixels according to an amount of received light by each of a plurality of light-receiving elements that are each provided respectively in each of the pixels and arranged in a light-receiving area that receives light from outside, the plurality of pixels being arranged to form a pixel row in the light-receiving area;
deriving the charge generated by each of the plurality of light-receiving elements by each of a plurality of pixel circuits that are each arranged so as to be respectively adjacent to each of the pixels provided in a non-light-receiving area, the non-light receiving area not receiving the light from outside and being provided so as to be adjacent to the light-receiving area;
converting the derived charges to generate an image data; and
forming an image based on the image data.

* * * * *